(12) United States Patent
Pu et al.

(10) Patent No.: US 6,646,349 B1
(45) Date of Patent: Nov. 11, 2003

(54) BALL GRID ARRAY SEMICONDUCTOR PACKAGE

(75) Inventors: Han-Ping Pu, Taichung (TW); Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/376,943

(22) Filed: Feb. 28, 2003

(30) Foreign Application Priority Data

Nov. 27, 2002 (TW) ........................................ 91134411 A

(51) Int. Cl.$^7$ .............................................. H01L 23/58
(52) U.S. Cl. ........................ 257/758; 257/701; 257/703; 174/260; 174/261; 361/748
(58) Field of Search ................................ 257/685, 686, 257/701, 738, 758, 763, 786, 666, 613, 787, 702, 703; 174/260, 261, 263, 265; 361/748, 764

(56) References Cited

U.S. PATENT DOCUMENTS

| | | | |
|---|---|---|---|
| 5,640,047 A | * | 6/1997 | Nakashima ................. 257/738 |
| 5,641,701 A | | 6/1997 | Fukuhara et al. ............... 438/6 |
| 6,054,767 A | | 4/2000 | Chia et al. ................... 257/738 |
| 6,303,878 B1 | * | 10/2001 | Kondo et al. ............... 174/261 |

* cited by examiner

Primary Examiner—Nathan J. Flynn
Assistant Examiner—Leonardo Andujar
(74) Attorney, Agent, or Firm—Peter F. Corless; Steven M. Jensen; Edwards & Angell, LLP

(57) ABSTRACT

A ball grid array semiconductor package is provided, wherein at least a predetermined position of a conductive trace on a substrate is formed with a discontinuity, allowing the discontinuity and part of the conductive trace around the discontinuity to be exposed to outside of solder mask applied over the substrate and form a discontinuous pad. The conductive trace having the discontinuous pad is electrically conducted as a solder ball is bonded to the discontinuous pad, and is electrically disconnected when the solder ball is not mounted on the discontinuous pad. As the solder ball is hardly bonded firmly to the discontinuous pad, it can be easily removed from the discontinuous pad to disconnect the conductive trace, and the removed solder ball can be simply mounted back to the discontinuous pad to restore electrical conduction of the conductive trace.

18 Claims, 7 Drawing Sheets

BALL GRID ARRAY SEMICONDUCTOR PACKAGE

FIELD OF THE INVENTION

The present invention relates to semiconductor packages, and more particularly, to a ball grid array (BGA) semiconductor package in which a plurality of solder balls act as input/output (I/O) ports for electrically connecting a semiconductor chip mounted in the semiconductor package to an external device.

BACKGROUND OF THE INVENTION

Semiconductor packages are advanced devices each of which is incorporated with at least a semiconductor chip on a chip carrier (such as substrate, lead frame, etc) and uses a plurality of conductive elements such as bonding wires or solder bumps (in a flip-chip structure) for electrically connecting the chip to the chip carrier. The chip and conductive elements are hermetically encapsulated by an encapsulant made of a resin material such as epoxy resin. Such a packaged chip can be electrically connected to an external device (such as printed circuit board, PCB) for subsequent operation via a plurality of input/output (I/O) ports on the chip carrier such as solder balls formed on the substrate, outer leads of the lead frame, etc.

In order to produce various semiconductor packages of different types and functions, semiconductor chips are normally made with multiple functions or in various grades; in other words, semiconductor packages can be divided into various grades for providing different functions or performances according to operation of different or certain functions of chips mounted in the semiconductor packages. The above mechanism can be accomplished by different arrangements of bonding wires; for example, a chip may proceed with a particular function with a particular set of bond pads on the chip being formed with bonding wires, and another function may be operated by connecting bonding wires to another set of bond pads on the chip, making package products classified in functions by different arrangements of bonding wires. However, a drawback of this method is that the bonding wires must be formed before performing a molding process for fabricating an encapsulant. As a result, it needs to predict product demand or types of package products with functions desired or required in the market and to pre-form corresponding arrangements of bonding wires for providing desirable functions for package products. This may easily bring about a problem that pre-formed products are not compliant with practical requirements and fail to be flexibly adjusted in response to variation of product demand in the market, whereby it may be short of products in demand but full of stocks of products that are out of date, thereby leading to significant waste of costs.

U.S. Pat. No. 6,054,767 discloses a substrate for a ball grid array (BGA) semiconductor package, characterized in that the substrate is formed with a plurality of conductive vias penetrating through the same and a plurality of conductive traces on at least a surface of the substrate, the conductive traces being electrically connected to a chip mounted on the substrate. The conductive traces are situated between adjacent conductive vias or in proximity to the conductive vias, and selectively electrically coupled to the conductive vias by bonding wires to thereby control operation of desirable or certain functions of the chip. Therefore, functional classification of package products can be simply accomplished through the use of a single substrate, such that costs can be reduced and demanded products can be quickly commercialized and available in the market. However, this method still needs to be implemented before the molding process and thus renders the foregoing problems of waste of costs and failure in flexible adjustment in response to product demand change in the market.

U.S. Pat. No. 5,641,701 discloses the use of laser technology to cut off conductive traces and form disconnection. In particular, a package structure with a multi-functional chip is subject to a laser process to cut off or disconnect predetermined conductive traces that are electrically connected to the chip, so as to interrupt certain functions of the chip and thereby categorize package products. This method is beneficial that cutting of the conductive traces can be performed after the molding process, allowing package products with desirable or different functions to be timely fabricated and flexibly adjusted according to product demand in the market.

However, the above method in the use of laser technology would leads to significant drawbacks. One is preparation of a laser machine to perform the laser cutting process; this laser machine is expensively fabricated and thereby remarkably increases fabrication costs of package products. Moreover, laser-cutting of conductive traces easily causes contamination and requires an extra cleaning process that also increases fabrication costs. Further, laser power needs to be precisely controlled; due to delicate internal structure of a semiconductor package, other structural portions such as lower conductive traces underneath targeted conductive traces may be damaged by inaccurate power control of laser for cutting conductive traces, making production yield undesirably degraded. Accordingly, a solution is not to form any conductive trace underneath targeted conductive traces to be cut off, or to pre-form a copper layer underneath the targeted conductive traces, so as to prevent other or unintended conductive traces from being damaged by laser. However, this method restricts circuitry or routability on the substrate, which effect would be significantly severe for package products with conductive traces arranged in high density. Furthermore, conductive traces once being cut off cannot be electrically reconnected: that is, once a semiconductor package is adapted to proceed with particular functions, it fails to be subject to any more functional alteration, which is unfavorable in response to variation of product demand in the market.

Therefore, the problem to be solved herein is to provide a semiconductor package that can be formed with desirable functions by low costs and simplified fabrication processes for categorizing package products.

SUMMARY OF THE INVENTION

A primary objective of the present invention is to provide a ball grid array (BGA) semiconductor package, which utilizes solder balls to make conductive traces electrically conducted or disconnected, allowing the semiconductor package to be formed with predetermined or desirable functions.

Another objective of the invention is to provide a BGA semiconductor package in which fabrication costs and process complexity can be reduced.

A further objective of the invention is to provide a BGA semiconductor package, which can prevent structural damage and assure production yield.

In accordance of the foregoing and other objectives, the present invention proposes a BGA semiconductor package, comprising: a substrate having an upper surface and a lower surface opposed to the upper surface, the upper and lower surfaces being formed with a plurality of conductive traces each of which has a terminal, wherein an insulating material is applied over the upper and lower surfaces of the substrate to cover the conductive traces with the terminals of the conductive traces being exposed to outside of the insulating material, and a plurality of conductive vias are formed through the substrate for electrically interconnecting the conductive traces on the upper and lower surfaces, and wherein at least a predetermined position of the conductive trace is formed with a discontinuity, allowing the discontinuity and a portion of the conductive trace around the discontinuity to be exposed to outside of the insulating material and form a discontinuous pad; at least a chip mounted on and electrically connected to the upper surface of the substrate; an encapsulant formed on the upper surface of the substrate for encapsulating the chip; and at least a first solder ball selectively and detachably implanted on the discontinuous pad in a manner that, the conductive trace having the discontinuous pad is electrically conducted as the first solder ball is bonded to the discontinuous pad, and is electrically disconnected as the discontinuous pad is free of the first solder ball thereon.

The above semiconductor package provides significant benefits. One is that predetermined positions of conductive traces on the substrate are formed with discontinuous pads, allowing solder balls (first solder balls) to be optionally implanted or not implanted on the discontinuous pads, wherein implantation of the first solder balls is simultaneously accomplished in a ball implanting process for forming second solder balls as I/O ports, thereby not increasing process complexity and costs of fabrication. As the first solder balls are hardly bonded firmly to the discontinuous pads, they can be easily removed or pushed away (e.g. by means of a rod) from the discontinuous pads, making conductive traces having the discontinuous pads be in electrical disconnection. This thereby does not require the use of expensive and complicated laser technology for cutting off conductive traces to possibly damage other part of structure, and is capable of preventing contamination from laser technology without having to perform an extra cleaning process. Therefore, the semiconductor package according to the invention can effectively reduce fabrication costs and simplify fabrication processes as well as assure yield of fabricated products. Moreover, the removed first solder balls can be easily bonded back to corresponding discontinuous pads to restore electrical conduction of conductive traces having the discontinuous pads. Therefore, by different arrangements of electrical conduction or disconnection of the conductive traces through the use of first solder balls being selectively bonded to the discontinuous pads, it would easily and flexibly control chip operation to make fabricated package products provided with desirable or predetermined functions in response to market demand.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a ball grid array (BGA) semiconductor package proposed in the present invention are described in detail with reference to FIGS. 1 to 7.

First Preferred Embodiment

Figure 1:
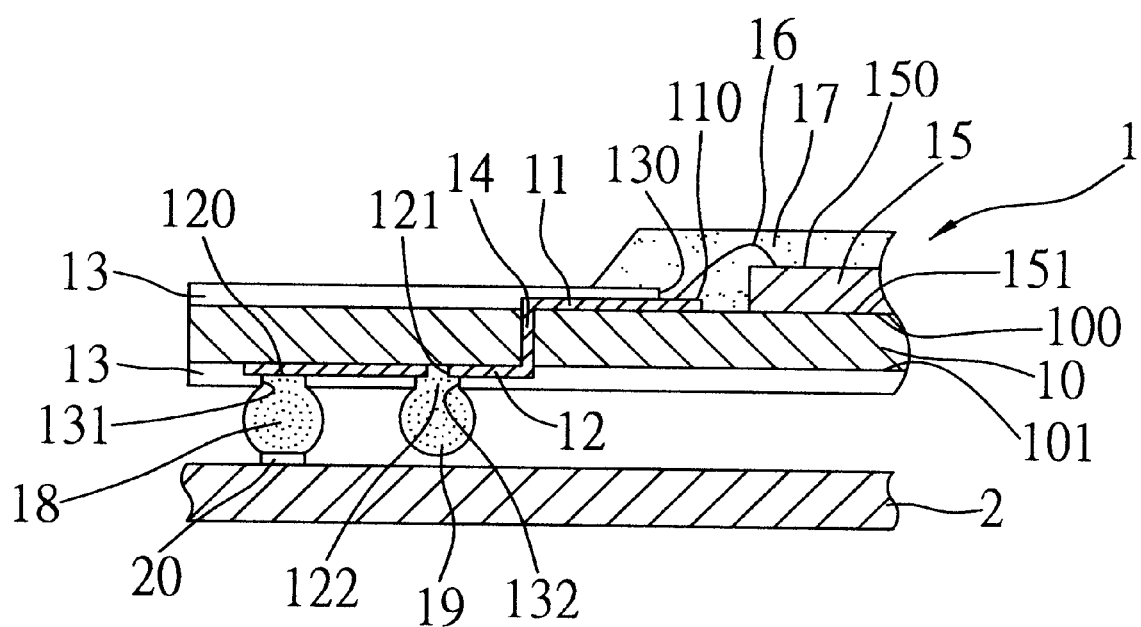
FIG. 1 is a cross-sectional view of a semiconductor package according to a first preferred embodiment of the invention.

As shown in FIG. 1, the semiconductor package 1 according to a first preferred embodiment of the invention is a BGA package structure utilizing a substrate 10 as a chip carrier. The substrate 10 can be made of a conventional resin material such as epoxy resin, polyimide resin, BT (bismaleimide triazine) resin, FR4 resin, FR5 resin, etc. The substrate 10 has an upper surface 100 and a lower surface 101 opposed to the upper surface 100, wherein a plurality of first conductive traces 11 are formed on the upper surface 100, and a plurality of second conductive traces 12 are formed on the lower surface 101 of the substrate 10, each of the first an d second conductive traces 11, 12 having a terminal 110, 120. The first and second conductive traces 11, 12 are fabricated by attaching at least a copper foil (not shown) to the upper and lower surfaces 100, 101 of the substrate 10 respectively and subjecting the copper foil to conventional exposing, developing and etching processes, which are not further detailed herein.

An insulating material 13 such as solder mask is applied over the upper and lower surfaces 100, 101 of the substrate 10 respectively and covers the first and second conductive traces 11, 12. A plurality of conductive vias 14 are formed through the substrate 10 and plated with a conductive metal (such as copper) therein, for electrically interconnecting the first conductive traces 11 on the upper surface 100 of the substrate 10 and the second conductive traces 12 on the lower surface 101 of the substrate 10.

Figure 2A:
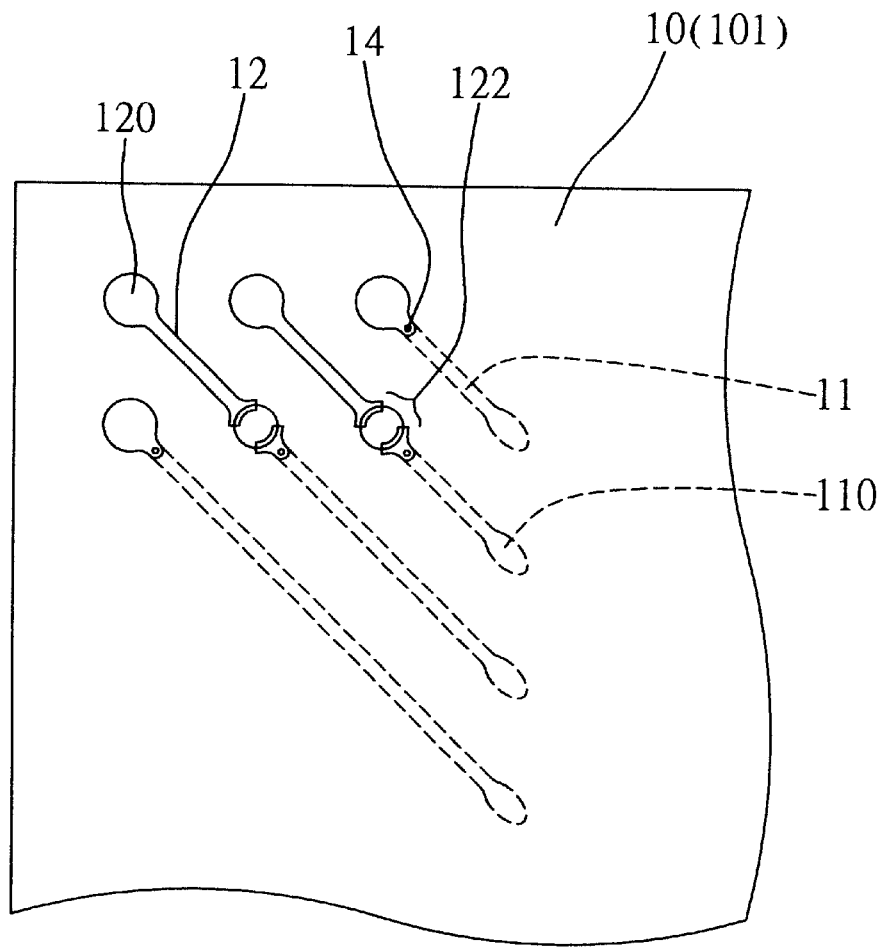
FIG. 2A is a bottom view of a substrate used in the semiconductor package shown in FIG. 1.
Figure 2B:
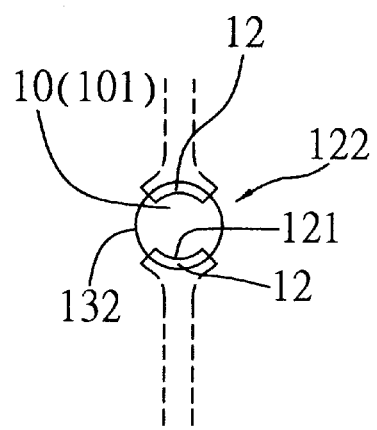
FIG. 2B is a bottom view of discontinuous pads in the semiconductor package shown in FIG. 1.

The solder mask 13 that covers the first and second conductive traces 11, 12 is formed with a plurality of openings 130, 131, allowing the terminals 110, 120 of the first and second conductive traces 11, 12 to be exposed outside respectively via the openings 130, 131. The exposed terminals 110 of the first conductive traces 11 are used as bond fingers (designated by the same reference numeral 110 as the corresponding terminals) where bonding wires are subsequently bonded, and the exposed terminals 120 of the second conductive traces 12 form input/output (I/O) pads (designated by the same reference numeral 120 as the corresponding terminals) where solder balls are subsequently implanted. Moreover, as shown in FIGS. 1, 2A and 2B, predetermined positions other than the terminals 120 of the second conductive traces 12 on the lower surface 101 of the substrate 10 are formed with discontinuities 121, and the solder mask 13 applied over the lower surface 101 of the substrate 10 are correspondingly formed with a plurality of openings 132 via which the discontinuities 121 and portions of the second conductive traces 12 around the discontinuities 121 are exposed to form discontinuous pads 122, allowing portions of the lower surface 101 of the substrate 10 corresponding in position to the discontinuities 121 to be also exposed to outside of the solder mask 13 via the openings 132.

Then, at least a chip 15 is prepared, having an active surface 150 where a plurality of electronic elements and circuits are disposed and a non-active surface 151 opposed to the active surface 150. A die-bonding process is performed to mount the non-active surface 151 of the chip 15 on the upper surface 100 of the substrate 10 via an adhesive (not shown). Thereafter, a wire-bonding process is implemented to form a plurality of bonding wires 16 on the upper surface 100 of the substrate 10, whereby the bonding wires 16 are bonded to the active surface 150 of the chip 15 and to the bond fingers 110 formed on the upper surface 100 of the substrate 10, making the active surface 150 of the chip 15 electrically connected to the upper surface 100 of the substrate 10 via the bonding wires 16.

Subsequently, a molding process is carried out by which a resin material such as epoxy resin is used to form an encapsulant 17 on the upper surface 100 of the substrate 10 for encapsulating the chip 15 and bonding wires 16 that are hermetically isolated and protected against external moisture or contaminant.

Finally, a ball-implanting process is performed to implant a plurality of second solder balls 18 at the I/O pads 120 formed on the lower surface 101 of the substrate 10, and to selectively bond first solder balls 19 on the discontinuous pads 122 in a detachable manner. The second solder balls 18 serve as I/O ports of the semiconductor package 1 to construct electrical connection with an external device such as printed circuit board (PCB) 2, as shown in FIG. 1, wherein surface mount technology (SMT) is employed for attaching the second solder balls 18 of the semiconductor package 1 to corresponding bond pads 20 formed on the PCB 2, making the chip 15 operate and electrically connected via the second solder balls 18 to the PCB 2.

Figure 3A:
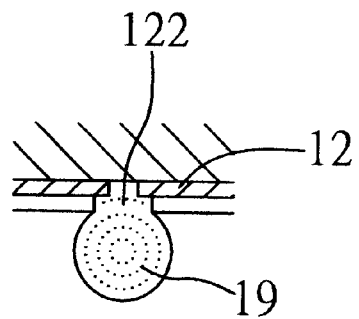
FIG. 3A is an enlarged view of a discontinuous pad formed with a solder ball in the semiconductor package shown in FIG. 1.
Figure 3A:
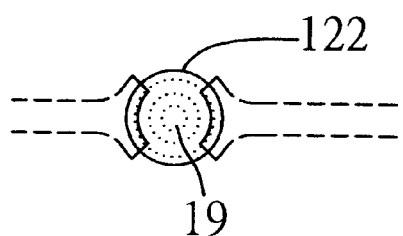
Figure 3B:
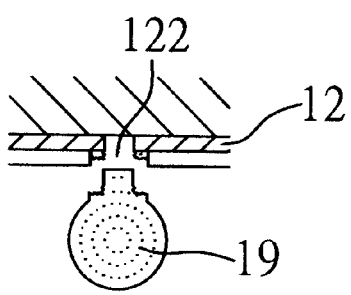
FIG. 3B is an enlarged view of the solder ball removed from the discontinuous pad in the semiconductor package shown in FIG. 1.
Figure 3B:
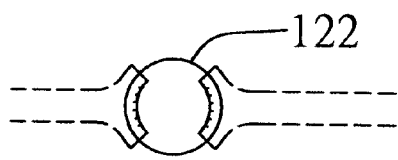

The first solder balls 19 formed on the discontinuous pads 122 can be optionally removed or pushed away. As shown in FIGS. 1 and 3A, when the discontinuous pads 122 are mounted with the first solder balls 19, the second conductive traces 12 having the discontinuous pads 122 are electrically conducted by which the second solder balls 18 implanted on the terminals or I/O pads 120 thereof can be electrically coupled to the bonding wires 16 bonded to the terminals or bond fingers 110 of the first conductive traces 11 via the second conductive traces 12, corresponding conductive vias 14 and first conductive traces 11 to consequently form electrical connection with the chip 15 by means of the bonding wires 16. As shown in FIG. 3B, as the first solder balls 19 are hardly bonded firmly to the discontinuous pads 122, it is relatively easy to remove or push away the first solder balls 19 from the discontinuous pads 122. If the discontinuous pads 122 are not mounted with first solder balls 19 or the first solder balls 19 are removed from the discontinuous pads 122, the second conductive traces 12 having the discontinuous pads 122 are electrically disconnected, such that the second solder balls 18 implanted on the I/O pads 120 fail to be electrically coupled to the bonding wires 16 bonded to the corresponding bond fingers 110 or the chip 15. As a result, by different or particular arrangements of electrical connection/disconnection through the use of the first solder balls 19 being selectively bonded to the discontinuous pads 122, the chip 15 would operate in a control manner as to make the fabricated semiconductor package 1 with predetermined or desirable functions.

Figure 4:
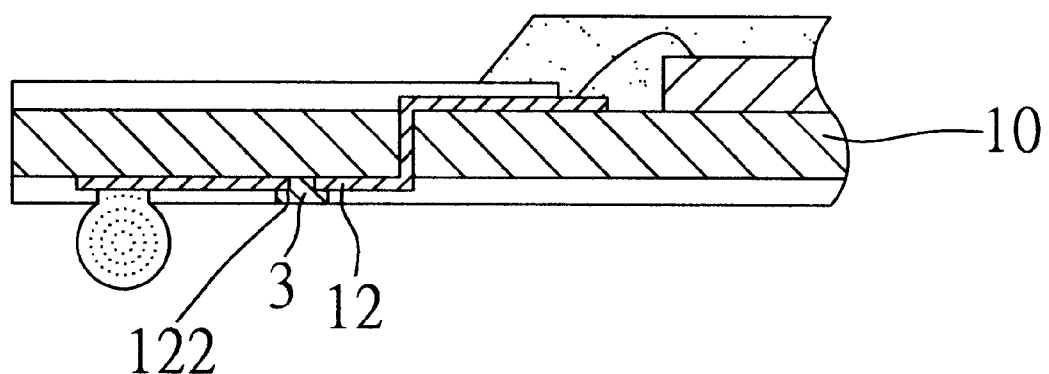
FIG. 4 is a cross-sectional view of the discontinuous pad applied with an insulating and highly adhesive material in the semiconductor package shown in FIG.

Further referring to FIG. 1, as the first solder balls 19 are used for functional adjustment but not as I/O ports and are selectively connected to the discontinuous pads 122, it is therefore not necessary to form corresponding bond pads on the PCB 2 for being bonded with the first solder balls 19. Moreover, as shown in FIG. 4, an insulating and highly adhesive material 3 can be applied on the discontinuous pads 122 that are not formed with the first solder balls 19, so as to prevent the exposed portions of the second conductive traces 12 and substrate 10 via the discontinuous pads 122 from being contaminated by external contaminant.

Figure 5A:
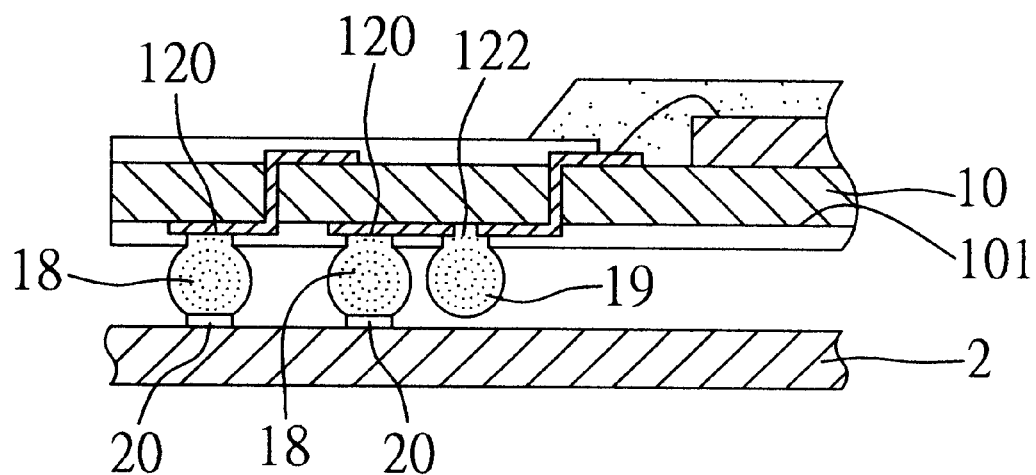
FIGS. 5A and 5B are respectively a cross-sectional view and a bottom view of arrangement of discontinuous pads in the semiconductor package shown in FIG. 1.
Figure 5B:
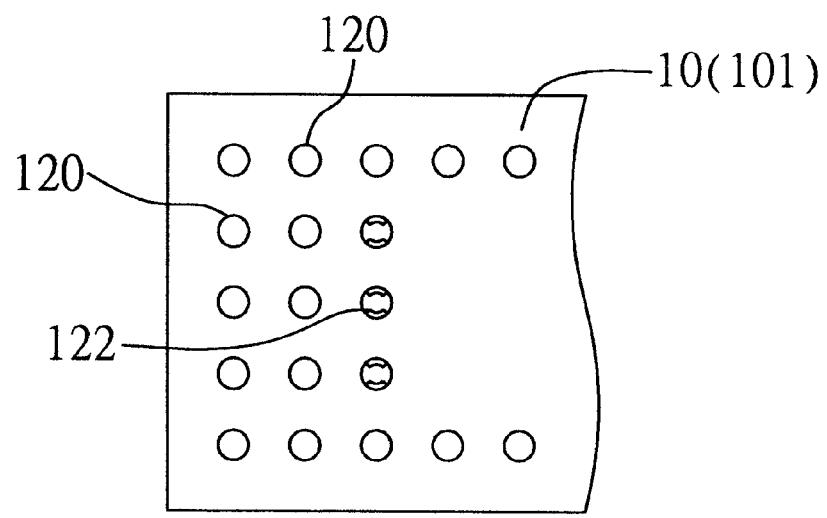

Furthermore, as shown in FIGS. 5A and 5B, discontinuous pads 122 can be located outside a region formed with the I/O pads 120 and second solder balls 18 on the lower surface 101 of the substrate 10, such that provision of the discontinuous pads 122 would not interfere the originally-designed arrangement of the I/O pads 120 on the substrate 10. As a result, since it is not necessary to form corresponding bond pads on the PCB 2 for being bonded with the first solder balls 19, thereby not affecting original circuitry or routability on the PCB 2 formed with bond pads 20 corresponding in position to the I/O pads 120 of the substrate 10.

Besides, electrical connection between the chip 15 and substrate 10 is not only limitedly accomplished by the above bonding wires 16, but can be formed by a flip-chip structure (not illustrated by drawings). In particular, the active surface of the chip is pre-mounted with a plurality of solder bumps, and terminals of the first conductive traces on the upper surface of the substrate act as bond pads for being bonded with the solder bumps on the chip, making the chip attached and electrically connected to the substrate in a face-down manner to form the flip-chip structure. It should be understood that other suitable techniques for the chip-substrate electrical connection are applicable herein.

Second Preferred Embodiment

Figure 6:
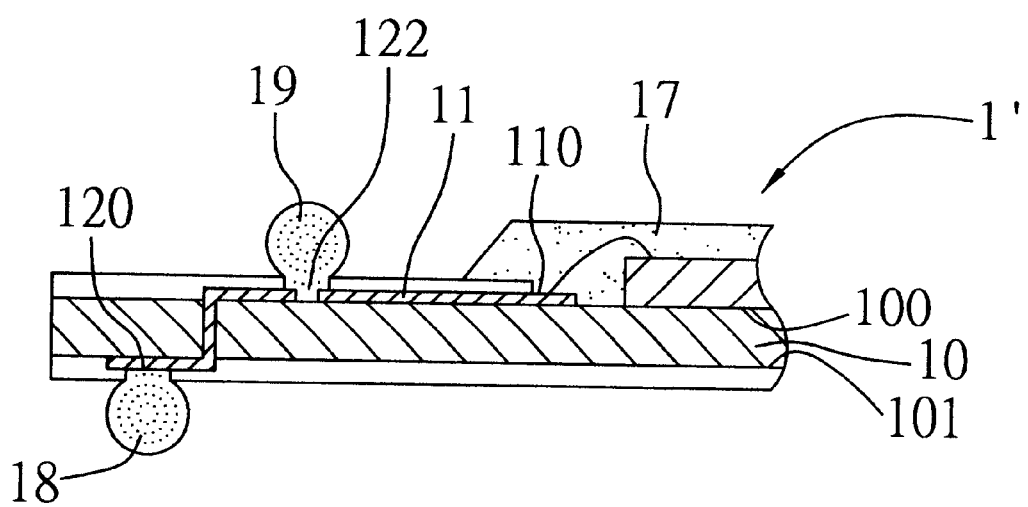
FIG. 6 is a cross-sectional view of a semiconductor package according to a second preferred embodiment of the invention.

FIG. 6 illustrates a semiconductor package 1' according to a second preferred embodiment of the invention. As shown in the drawing, this semiconductor package 1' is similar in structure to the semiconductor package 1 of the first embodiment shown in FIG. 1, with the difference in that discontinuous pads 122 and first solder balls 19 are provided on the upper surface 100 of the substrate 19. In particular, the discontinuous pads 122 are formed at predetermined positions other than terminals,(or bond fingers) 110 of the first conductive traces 11 on the upper surface 100 of the substrate 10. The discontinuous pads 122 and first solder balls 19 are not encapsulated by the encapsulant 17 formed on the substrate 10, so as to allow the first solder balls 19 to be optionally removed from the discontinuous pads 122. Moreover, as the discontinuous pads 122 and first solder balls 19 are disposed on the upper surface 100 of the substrate 10, they would not occupy area for the arrangement of I/O pads 120 and second solder balls 18 on the lower surface 101 of the substrate 10, such that more I/O pads 120 and second solder balls 18 can be formed in response to highly integrated chips.

Third Preferred Embodiment

Figure 7A:
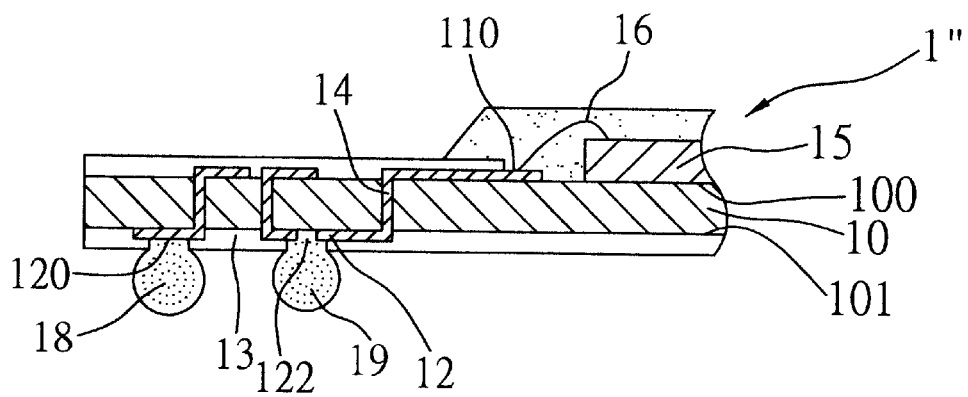
FIG. 7A is a cross-sectional view of a semiconductor package according to a third preferred embodiment of the invention.

FIG. 7A illustrates a semiconductor package 1" according to a third preferred embodiment of the invention. As shown in the drawing, this semiconductor package 1" is similar in structure to the semiconductor package 1 of the first embodiment shown in FIG. 1, with the difference in that predetermined terminal positions of the second conductive traces 12 on the lower surface 101 of the substrate 10 are formed with discontinuous pads 122 instead of I/O pads. In other words, the second conductive traces 12 having the discontinuous pads 122 are electrically connected to bond fingers 110 formed on the upper surface 100 of the substrate 10 via corresponding conductive vias 14, but not electrically coupled to I/O pads 120 or second solder balls 18 as I/O ports.

Figure 7B:
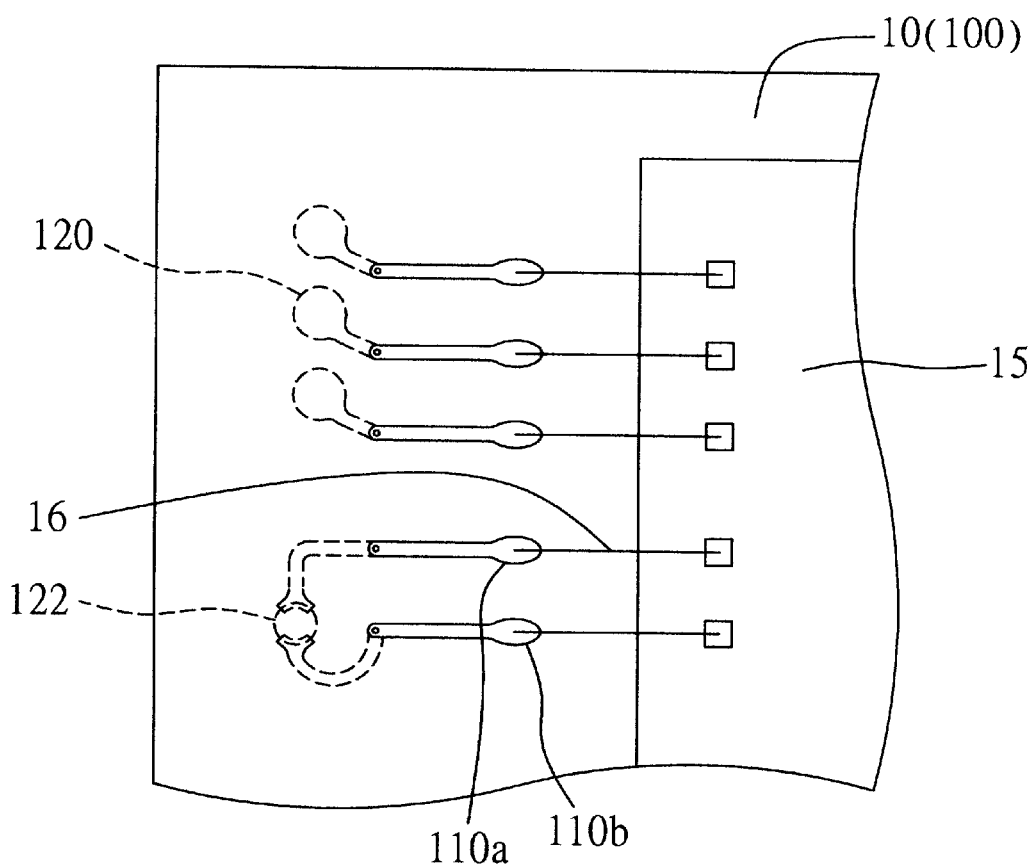
FIG. 7B is a top view of electrical connection between a chip and a substrate in the semiconductor package shown in FIG. 7A.

Therefore, for operating certain functions provided from a chip, it can be accomplished by controlling electrical connection and disconnection of bond fingers where bonding wires are bonded for electrically connecting the chip to the substrate. As shown in FIGS. 7A and 7B, with a first solder ball 19 being implanted on the discontinuous pad 122, bond fingers 110a, 110b are electrically interconnected, and thus the chip 15 is electrically coupled to the substrate 10 by bonding wires 16 bonded to the bond fingers 110a, 110b and capable of operating its functions. When the discontinuous pad 122 is not formed with a first solder ball 19, bond fingers 110a, 110b are electrically disconnected from each other, making the chip 15 fail to proceed with functions thereof and thereby selectively controlling operation of the chip 15.

Similarly, the discontinuous pads formed at terminal positions can also be located on the upper surface of the substrate (not illustrated by drawings); that is, predetermined terminal positions of the first conductive traces on the upper surface of the substrate are formed with discontinuous pads instead of being used as bond fingers where bonding wires are bonded, and these discontinuous pads are adapted to be electrically connected to the conductive traces having bond fingers.

The above semiconductor package provides significant benefits. One is that predetermined positions of conductive traces on the substrate are formed with discontinuous pads, allowing solder balls (first solder balls) to be optionally implanted or not implanted on the discontinuous pads, wherein implantation of the first solder balls is simultaneously accomplished in a ball implanting process for forming second solder balls as I/O ports, thereby not increasing process complexity and costs of fabrication. As the first solder balls are hardly bonded firmly to the discontinuous pads, they can be easily removed or pushed away (e.g. by means of a rod) from the discontinuous pads, making conductive traces having the discontinuous pads be in electrical disconnection. This thereby does not require the use of expensive and complicated laser technology for cutting off conductive traces to possibly damage other part of structure, and is capable of preventing contamination from laser technology without having to perform an extra cleaning process. Therefore, the semiconductor package according to the invention can effectively reduce fabrication costs and simplify fabrication processes as well as assure yield of fabricated products. Moreover, the removed first solder balls can be easily bonded back to corresponding discontinuous pads to restore electrical conduction of conductive traces having the discontinuous pads. Therefore, by different arrangements of electrical conduction or disconnection of the conductive traces through the use of first solder balls being selectively bonded to the discontinuous pads, it would easily and flexibly control chip operation to make fabricated package products provided with desirable or predetermined functions in response to market demand.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ball grid array (BGA) semiconductor package, comprising:

a substrate having an upper surface and a lower surface opposed to the upper surface, the upper and lower surfaces being formed with a plurality of conductive traces each of which has a terminal, wherein an insulating material is applied over the upper and lower surfaces of the substrate to cover the conductive traces with the terminals of the conductive traces being exposed to outside of the insulating material, and a plurality of conductive vias are formed through the substrate for electrically interconnecting the conductive traces on the upper and lower surfaces, and wherein at least a predetermined position other than the terminal of the conductive trace is formed with a discontinuity, allowing the discontinuity and a portion of the conductive trace around the discontinuity to be exposed to outside of the insulating material and form a discontinuous first pad;

at least a chip mounted on and electrically connected to the upper surface of the substrate;

an encapsulant formed on the upper surface of the substrate for encapsulating the chip; and at least a first solder ball selectively and detachably implanted on the discontinuous first pad in a manner that, the conductive trace having the first pad is electrically conducted as the first solder ball is bonded to the first pad, and is electrically disconnected as the first pad is free of the first solder ball thereon.

2. The BGA semiconductor package of claim 1, wherein the first pad is formed on the lower surface of the substrate.

3. The BGA semiconductor package of claim 1, wherein the first pad is formed on the upper surface of the substrate.

4. The BGA semiconductor package of claim 1, wherein the exposed terminals of the conductive traces on the lower surface of the substrate form second pads where a plurality of second solder balls are implanted for electrically connecting the chip to an external device.

5. The BGA semiconductor package of claim 1, wherein the exposed terminals of the conductive traces on the upper surface of the substrate form bond fingers where a plurality of bonding wires are bonded for electrically connecting the chip to the substrate.

6. The BGA semiconductor package of claim 1, wherein the exposed terminals of the conductive traces on the upper surface of the substrate form third pads where a plurality of solder bumps are implanted for electrically connecting the chip to the substrate.

7. The BGA semiconductor package of claim 1, wherein the insulating material is solder mask.

8. The BGA semiconductor package of claim 1, wherein if the first pad is free of the first solder ball thereon, an insulating and highly adhesive material is applied over the first pad.

9. A ball grid array (BGA) semiconductor package, comprising:

a substrate having an upper surface and a lower surface opposed to the upper surface, the upper and lower surfaces being formed with a plurality of conductive traces each of which has a terminal, wherein an insulating material is applied over the upper and lower surfaces of the substrate to cover the conductive traces with the terminals of the conductive traces being exposed to outside of the insulating material, and a plurality of conductive vias are formed through the substrate for electrically interconnecting the conductive traces on the upper and lower surfaces, and wherein at least a predetermined terminal position of the conductive trace is formed with a discontinuity, allowing the discontinuity and a portion of the conductive trace around the discontinuity to be exposed to outside of the insulating material and form a discontinuous first pad;

at least a chip mounted on and electrically connected to the upper surface of the substrate;

an encapsulant formed on the upper surface of the substrate for encapsulating the chip; and at least a first solder ball selectively and detachably implanted on the discontinuous first pad in a manner that, the conductive trace having the first pad is electrically conducted as the first solder ball is bonded to the first pad, and is electrically disconnected as the first pad is free of the first solder ball thereon.

10. The BGA semiconductor package of claim 9, wherein the first pad is formed on the lower surface of the substrate.

11. The BGA semiconductor package of claim 9, wherein the first pad is formed on the upper surface of the substrate.

12. The BGA semiconductor package of claim 10, wherein the exposed terminals of the conductive traces not formed with the first pad on the lower surface of the substrate form second pads where a plurality of second solder balls are implanted for electrically connecting the chip to an external device.

13. The BGA semiconductor package of claim 11, wherein the exposed terminals of the conductive traces not formed with the first pad on the upper surface of the substrate form bond fingers where a plurality of bonding wires are bonded for electrically connecting the chip to the substrate.

14. The BGA semiconductor package of claim 13, wherein the conductive trace having the first pad is electrically coupled to the conductive traces formed with the bond fingers on the upper surface of the substrate.

15. The BGA semiconductor package of claim 11, wherein the exposed terminals of the conductive traces not formed with the first pad on the upper surface of the substrate form third pads where a plurality of solder bumps are implanted for electrically connecting the chip to the substrate.

16. The BGA semiconductor package of claim 15, wherein the conductive trace having the first pad is electrically coupled to the conductive traces formed with the third pads on the upper surface of the substrate.

17. The BGA semiconductor package of claim 9, wherein the insulating material is solder mask.

18. The BGA semiconductor package of claim 9, wherein if the first pad is free of the first solder ball thereon, an insulating and highly adhesive material is applied over the first pad.

\* \* \* \* \*